United States Patent [19]

Tsang et al.

[11] Patent Number: 5,543,013

[45] Date of Patent: Aug. 6, 1996

[54] METHOD OF FORMING A MICROSTRUCTURE WITH BARE SILICON GROUND PLANE

[75] Inventors: Robert W. K. Tsang, Bedford; Jeffrey A. Farash, Holbrook; Richard S. Payne, Andover, all of Mass.

[73] Assignee: Analog Devices, Inc., Woburn, Mass.

[21] Appl. No.: 348,374

[22] Filed: Dec. 1, 1994

[51] Int. Cl.⁶ ...................................................... H01L 21/00
[52] U.S. Cl. ..................... 156/643.1; 156/657.1; 216/2; 437/228
[58] Field of Search .............. 156/643.1, 647.1, 156/650.1, 651.1, 653.1, 657.1, 659.11, 661.11, 662.1, 628.1; 216/2, 41; 437/228, 238, 241, 228 SE; 73/517 R, 517 AV

[56] References Cited

U.S. PATENT DOCUMENTS

| | | | |
|---|---|---|---|
| 4,893,509 | 1/1990 | MacIver et al. | 216/2 X |
| 5,000,818 | 3/1991 | Thomas et al. | 156/657.1 X |
| 5,025,346 | 6/1991 | Tang et al. | 361/283 |
| 5,314,572 | 5/1994 | Core et al. | 156/643 |

OTHER PUBLICATIONS

"Surface Micromachined, Digitally Force–Balanced Accelerometer With Integrated CMOS Detection Circuitry," Yun, et. al., IEEE Solid–State Sensor and Actuator Workshop, Hilton Head Island, SC, Jun. 22–25, 1992.
"Large Displacement Linear Actuator," Brennen, et. al., IEEE Solid–State Sensor and Actuator Workshop, Hilton Head Island, SC, Jun. 4–7, 1990.
Putty et al, "Process Integration for Active Polysilicon Resonant Microstructures", *Sensors and Actuators*, vol. 20, No. 1/2, pp. 143–151, Nov. 1989.
Cho et al, "Slide Film Damping in Laterally Driven Microstructures", *Sensors and Actuators*, vol. A40, pp. 31–39, Jan. 1994.
Tang et al, "Laterally Driven Polysilicon Resonant Microstructures", *Sensors and Actuators*, vol. 20, No. 1/2, pp. 25–32, Nov. 1989.

*Primary Examiner*—William Powell
*Attorney, Agent, or Firm*—Hale and Dorr

[57] ABSTRACT

A method for providing a conductive ground plane beneath a suspended microstructure. A conductive region is diffused into a substrate. Two dielectric layers are added: first a thermal silicon dioxide layer and then a silicon nitride layer. A first mask is used to etch a ring partially through the silicon nitride layer. Then, a second mask is used to etch a hole through both dielectric layers in a region having a perimeter that extends between the inner and outer edges of the ring. This leaves the conductive region exposed in an area surrounded by a ring that has the silicon dioxide layer and a narrow silicon nitride layer. The ring is surrounded by an area in which the silicon dioxide and silicon nitride layers have not been reduced. A spacer silicon dioxide layer is deposited over the dielectric and then a polysilicon layer is deposited and formed into the shape of a the suspended microstructure. When the spacer layer is etched away, the silicon dioxide under the narrow silicon nitride layer is removed, along with the narrow silicon nitride layer, leaving an exposed ground plane surrounded by a dielectric with minimal undercutting.

18 Claims, 5 Drawing Sheets

METHOD OF FORMING A MICROSTRUCTURE WITH BARE SILICON GROUND PLANE

FIELD OF THE INVENTION

This invention relates to the field of micromachined electromechanical structures and, more particularly, to structures for minimizing capacitances in micromachined electro-mechanical structures.

BACKGROUND OF THE INVENTION

Movable micromachined silicon structures have numerous uses. They frequently are used as sensors and actuators, and for signal processing. For example, the fingers of a movable mass may be positioned between stationary plates to form a differential capacitor. When a force is applied to the structure, the movable mass moves relative to the plates, changing the capacitances and inducing an amplitude modulated signal onto the mass. The induced signal, which is proportional to the magnitude and duration of the acceleration, may be output for further processing. An example of such a device is described in U.S. Pat. No. 5,345,824, entitled "Monolithic Accelerometer," which is incorporated herein by reference.

In designing a micromachined electro-mechanical structure, it is important that parasitic capacitances be minimized. One technique that has been developed to combat this problem is to place a conductive ground plane between the substrate and the movable mass, so as to isolate the mass from the substrate. U.S. patent application Ser. No. 08/347,702, entitled "Conductive Plane Beneath Suspended Microstructure," filed Dec. 1, 1994, by R. Howe, et al., which is commonly assigned and is incorporated herein by reference, describes an improved ground plane, which is exposed rather than covered by a dielectric, and a method for manufacturing such an exposed ground plane. Through that structure and method, parasitic capacitances are greatly reduced. However, precise positioning and substantially vertical etching of the edges of the dielectric surrounding the exposed portion of the ground plane remains difficult to achieve.

The present invention overcomes these problems as will be shown in the remainder of the specification referring to the attached drawings.

SUMMARY OF THE INVENTION

The present invention is a method for making a micromachined electro-mechanical structure, in which a movable mass is positioned above an exposed conductive plane.

In a preferred embodiment, a silicon ground plane is formed from an n+ region diffused into a p-silicon substrate. Two dielectric layers are then formed over the substrate. First, a thermal silicon dioxide dielectric layer is formed, and then a silicon nitride layer is deposited. Because the two different dielectric layers react at different rates to many etching agents, more precise etching may be achieved, as described below.

A first mask is used to etch a ring into, but not completely through, the silicon nitride layer, to form a mask LEDGE area. The mask LEDGE area, and the area within it, define the area that will become the exposed ground plane.

A second mask is then used to etch a hole completely through the silicon nitride layer, to form a mask EQUIP area. The hole extends inward from a perimeter between the inner and outer edges of the mask LEDGE area. The result is a central portion in which the silicon nitride is completely etched away, which is surrounded by a LEDGE in which the silicon nitride is partially etched away. The LEDGE is surrounded by the un-etched silicon nitride layer.

A silicon dioxide spacer layer is then added, which covers the silicon nitride layer, the LEDGE, and the inner region in which the silicon nitride layer has been removed. The spacer layer permits a polysilicon layer to be deposited, to form the microstructure that will be suspended over what will become the exposed ground plane.

When the silicon dioxide spacer layer is etched away, to leave the polysilicon microstructure suspended above the substrate, the silicon dioxide under the LEDGE is etched away along with the LEDGE. The result is an exposed ground plane, with minimal undercutting of the surrounding dielectric.

Alternatively, the mask LEDGE step can be omitted. Although this does not prevent undercutting to the same degree, it provides a simpler, cheaper, and effective process for making the exposed ground plane.

Preferably, in normal operation, the ground plane is driven to follow the voltage of the movable mass, thereby eliminating parasitic capacitances between the mass and the ground plane or the substrate and increasing the accuracy and sensitivity of the device.

An object of the present invention is to provide an improved method for manufacturing a micromachined structure with reduced parasitic capacitances.

A further object of the present invention is to provide a method for manufacturing a micromachined structure with an exposed ground plane.

DETAILED DESCRIPTION OF THE INVENTION

Figure 1:
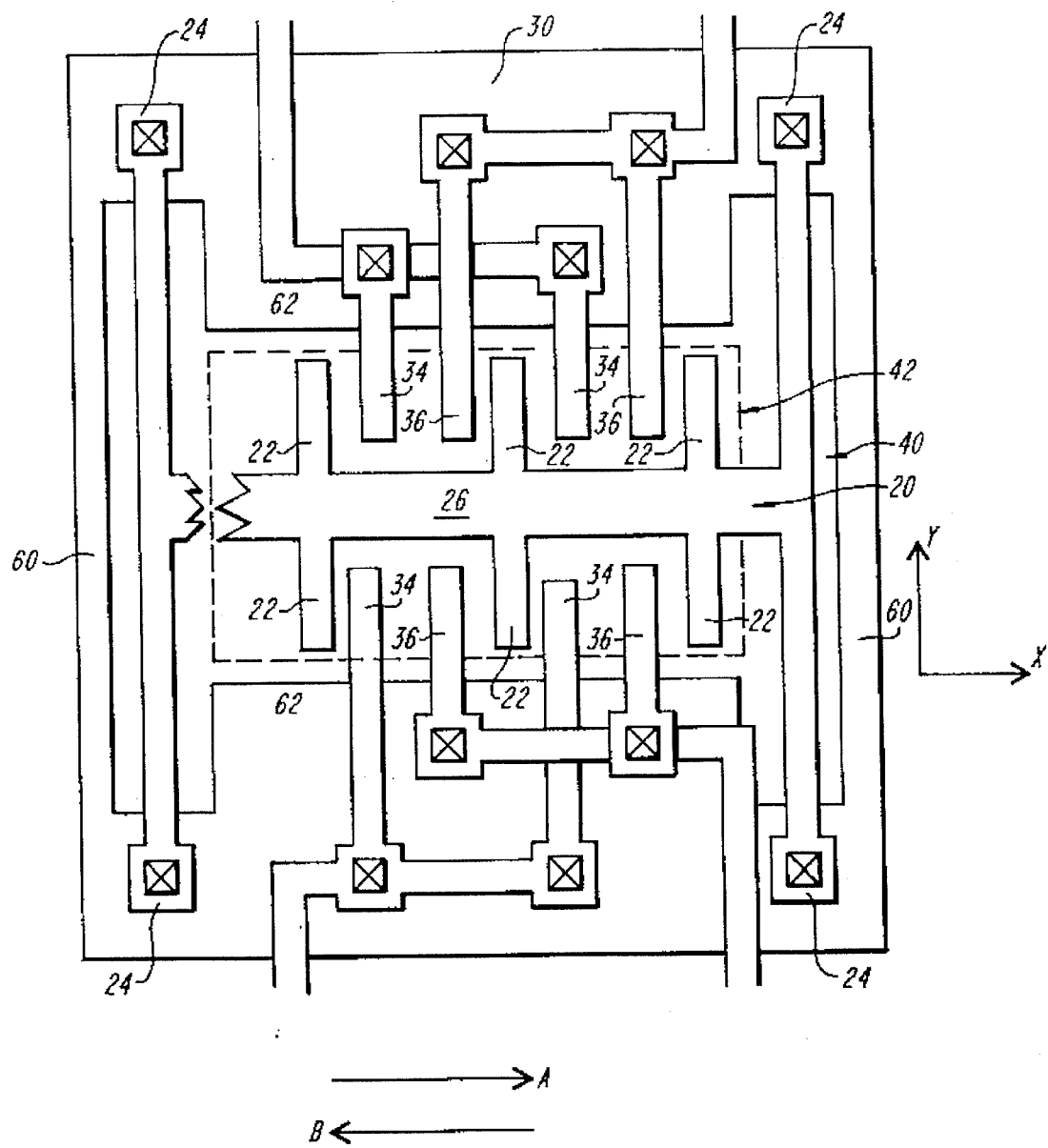
FIG. 1 is a top view of a micromachined electro-mechanical structure with an exposed ground plane manufactured according to the present invention.

With reference to FIG. 1, a portion of a micromachined electromechanical structure is shown. A polysilicon movable mass 20 includes a central beam 26, from which extend fingers 22. Mass 20 is suspended by anchors 24 above substrate 30, so that it moves in directions "A" and "B" in response to a force along the X-axis. Fixed fingers 34 and 36 are interleaved between mass fingers 22 to form a differential capacitor. The capacitance of the differential capacitor changes in response to movement of mass 20 and its fingers 22 relative to fixed fingers 34 and 36.

Diffused into substrate 30 is n+ region 40, which serves as a ground plane. Preferably, n+ region 40 is situated below all of mass fingers 22, which perform the sensing function, central beam 26 of mass 20, and a portion of fixed fingers 34 and 36. Area 42 of n+ region 40 is exposed according to the present invention.

Figure 2:
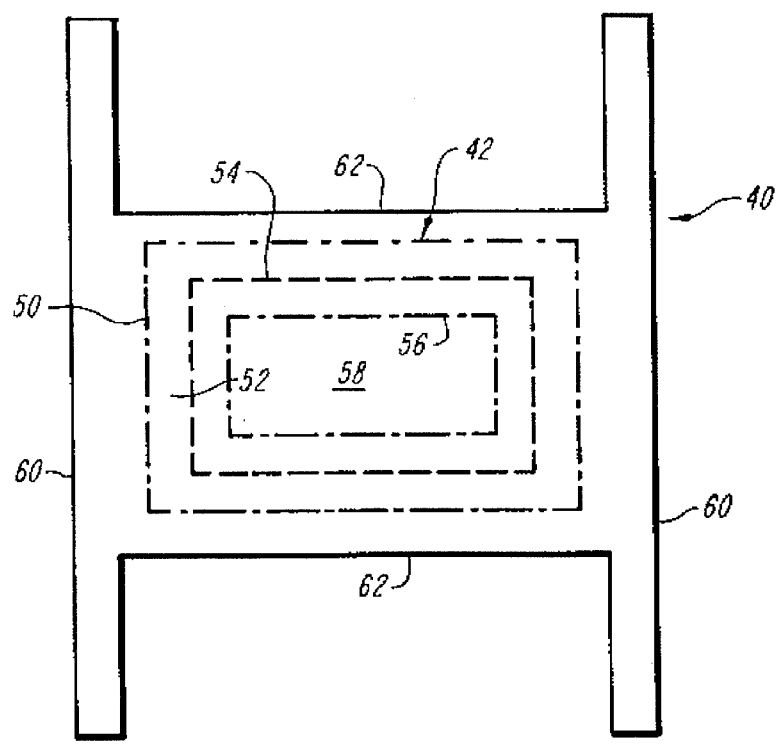
FIG. 2 is a partial top view of the substrate structure with an exposed ground plane that shows the positioning of the diffused region, the mask LEDGE area, and the mask EQUIP area according to the present invention.

FIG. 2 shows the placement of the mask LEDGE and mask EQUIP areas within n+ diffused area 40. Mask LEDGE area 52 is a ring having an outer edge 50 and an inner edge 56. Outer edge 50 defines the extent of the exposed area 42 of n+ diffused area 40. Mask EQUIP area 58 has a perimeter 54, between outer edge 50 and inner edge 56 of mask LEDGE area 52.

Preferably, outer edge 50 is approximately 12 micrometers from long sides 60 of n+ diffused area 40, and approximately 10 micrometers from short sides 62 of n+ diffused area 40. In a preferred embodiment, the distance between outer edge 50 and inner edge 56 of mask LEDGE area 52 is 15 micrometers, with the distance between outer edge 50 and perimeter 54 being 10 micrometers and the distance between perimeter 54 and inner edge 56 being 5 micrometers.

Steps in the process for manufacturing the exposed ground plane are shown in FIGS. 3–8. Numerous conventional steps in the fabrication process have been omitted as unnecessary to teach those skilled in the art the process of the current invention.

Figure 3:
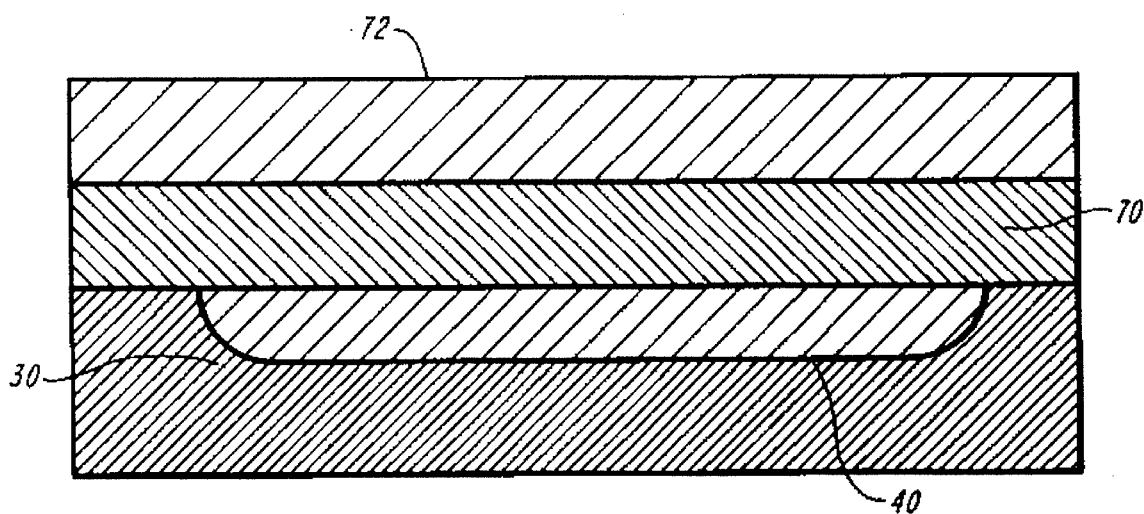
FIG. 3 is a cross-sectional view of the region around the ground plane of a micromachined structure according to the present invention after the first silicon dioxide layer and the silicon nitride layer have been formed.

As shown in FIG. 3, n+ region 40 is implanted and then diffused into p-silicon substrate 30. Thermal silicon dioxide layer 70, approximately 0.135 micrometers thick, is formed over substrate 30, including n+ region 40. Silicon nitride layer 72, approximately 0.12 micrometers thick, is then deposited over silicon dioxide layer 70.

Figure 4:
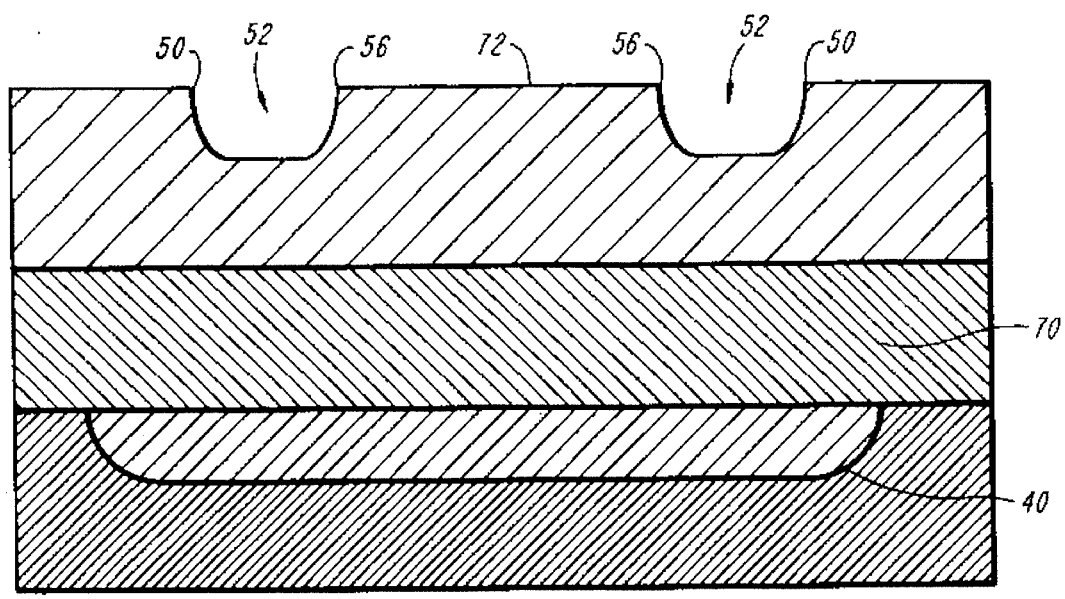
FIG. 4 is a cross-sectional view of the region around the ground plane of a micromachined structure according to the present invention after etching of the mask LEDGE.

As shown in FIGS. 2 and 4, mask LEDGE ring 52 is etched approximately 0.07 micrometers into silicon nitride layer 72. Outer edge 50 and inner edge 56 of mask LEDGE ring 52 are approximately 15 micrometers apart.

Figure 5:
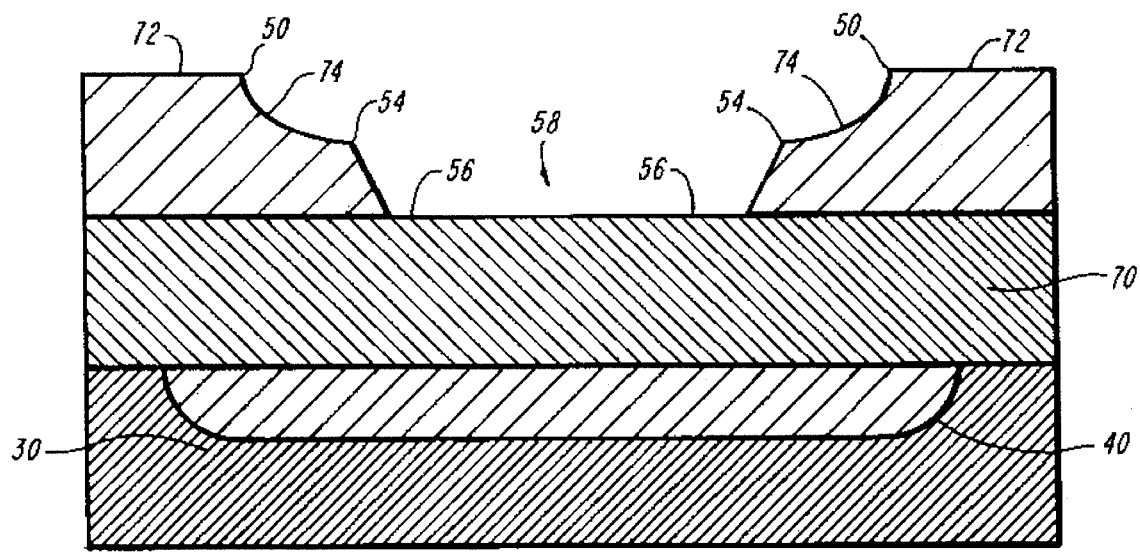
FIG. 5 is a cross-sectional view of the region around the ground plane of a micro-machined structure according to the present invention after etching of the mask EQUIP.

As shown in FIGS. 2 and 5, mask EQUIP area 58 is then etched completely through silicon nitride layer 72 within perimeter 54. Perimeter 54 is approximately 10 micrometers inside of outer edge 50 and 5 micrometers outside of inner edge 56 of mask LEDGE ring 52. The result is mask EQUIP area 58, in which silicon dioxide layer 70 is exposed, surrounded by 10 micrometer wide ring 74, which has a layer of silicon nitride approximately 0.05 micrometers thick. The full 0.12 micrometer thick silicon nitride layer 72 surrounds ring 74.

Figure 6:
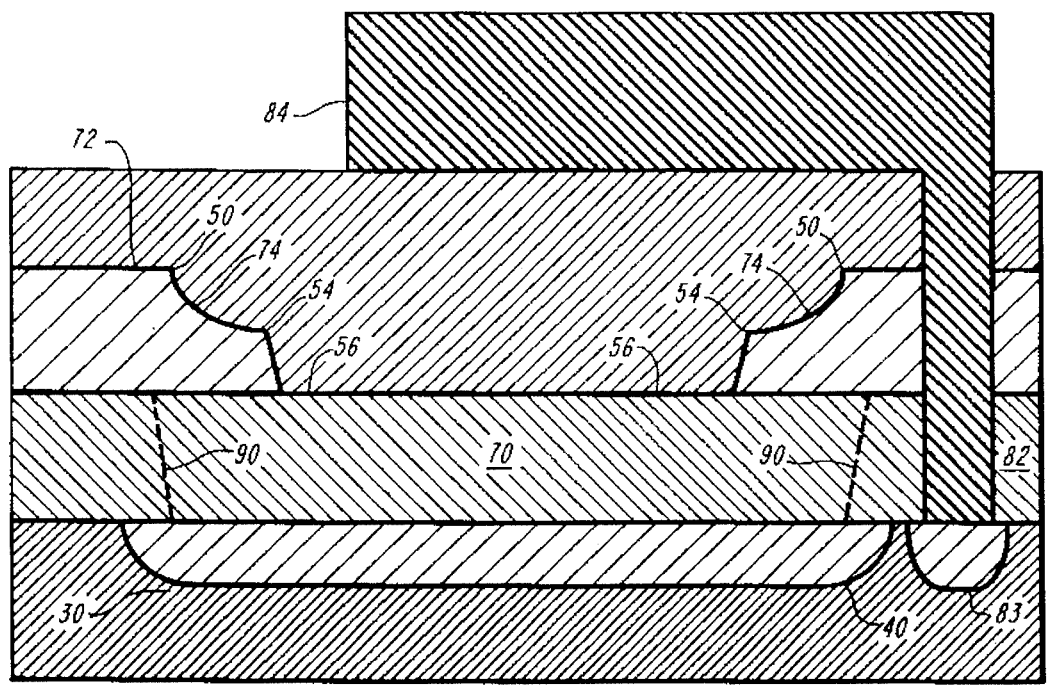
FIG. 6 is a cross-sectional view of the region around the ground plane of a micro-machined structure according to the present invention after the depositing of the spacer layer, and depositing and patterning of the polysilicon layer.

As shown in FIG. 6, silicon dioxide spacer layer 80 is deposited over silicon nitride layer 72 and the exposed part of silicon dioxide layer 70. After etching though spacer layer 80, silicon nitride layer 72, and silicon dioxide layer 70 to form anchor regions 82 on n+ regions 83, a polysilicon layer is deposited and then patterned to form movable microstinc-ture 84. Microstructure 84 is positioned over an area within outer edge 50 of ring 74. Only a portion of microstructure 84 is shown in FIGS. 6, 7, and 8.

Figure 7:
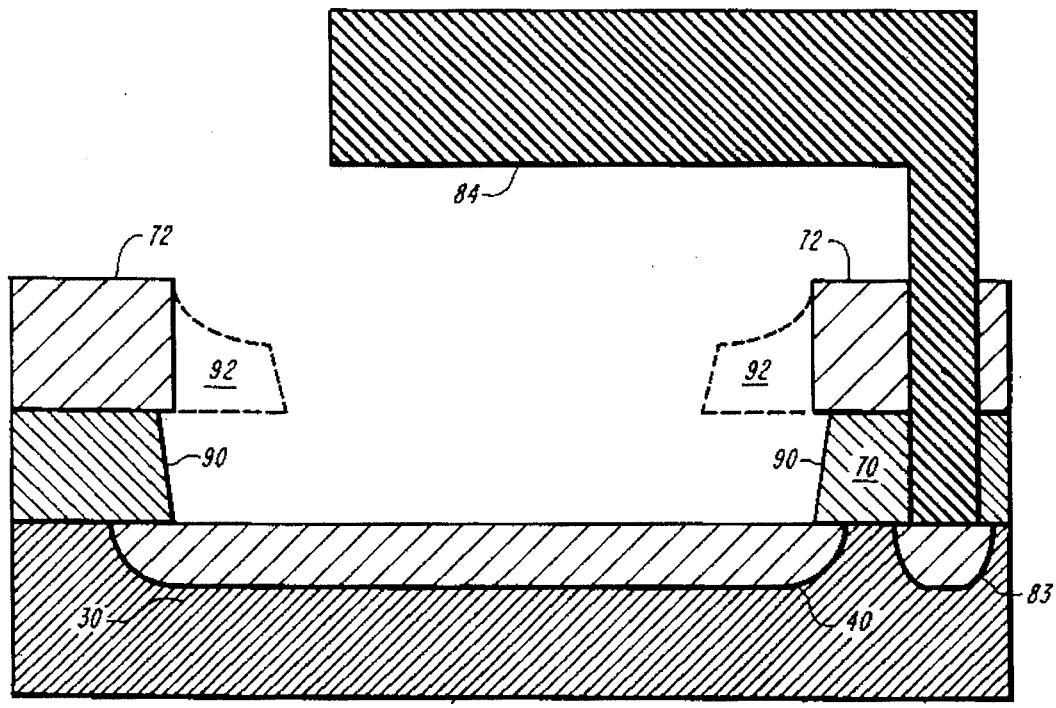
FIG. 7 is a cross-sectional view of the region around the ground plane of a micro-machined structure according to the present invention after exposure of the ground plane underneath the movable structure.

After spacer layer 80 is removed, the resulting structure is as shown in FIG. 7. The silicon dioxide of layer 70 under ring 74 is etched along with spacer layer 80, approximately to the position shown at 90 in FIGS. 6 and 7. The narrow silicon nitride layer within ring 74 prevents further etching of silicon dioxide layer 70 underneath silicon nitride layer 72, but is also etched along with spacer layer 80 (the location of the narrow silicon layer prior to etching is shown with dotted lines 92 in FIG. 7). This leaves an exposed area 42 in n+ region 40 below microstructure 84. Because of ring 74 (shown in FIG. 6), the walls surrounding exposed area 42 formed by the edges of silicon dioxide layer 70 and silicon nitride layer 72 exhibit minimal undercutting.

It is understood that area 42 will still be exposed even if a native oxide layer coats the surface.

Figure 8:
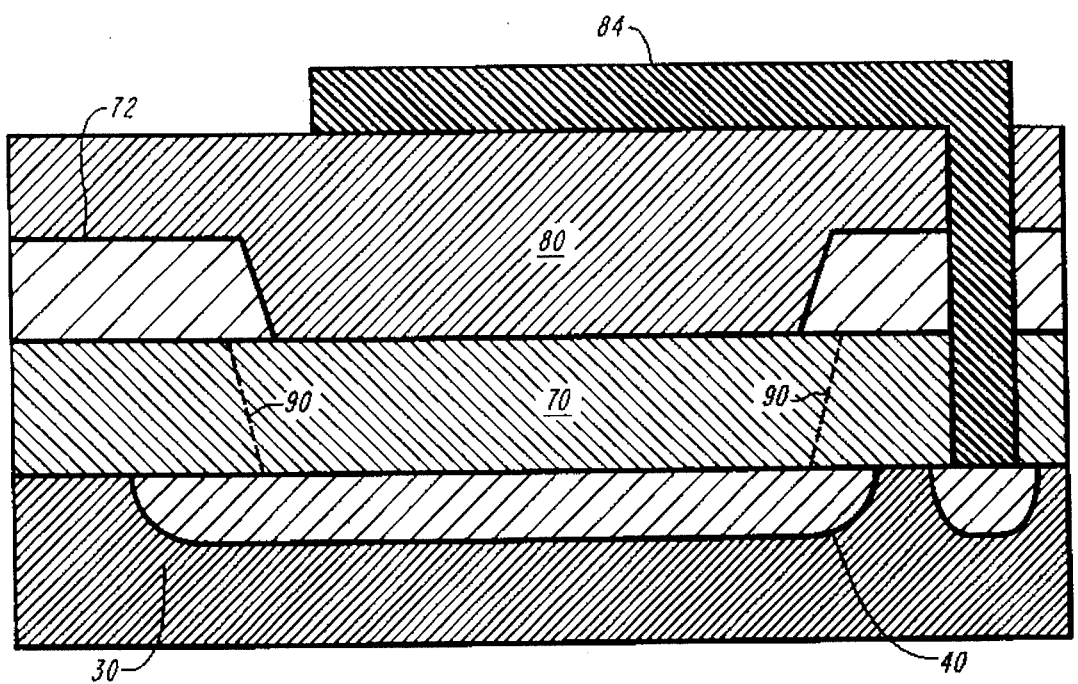
FIG. 8 is a cross-sectional view of the region around the ground plane of a micro-machined structure according to a second embodiment of the present invention in which only a single mask is used, at the same stage as shown in FIG. 6.

A second embodiment is shown in FIG. 8. In FIG. 8, elements that are the same as those shown in FIG. 6 have the same reference numeral. In this embodiment, only a single ground plane mask is used to etch the silicon nitride layer. As a result, during removal of spacer layer 80, silicon dioxide layer 70 will be etched in the area shown by dotted lines 96, leaving a small undercutting of silicon dioxide layer 70 beneath silicon nitride layer 72 (shown with dotted lines 90).

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

We claim:

1. A method for fabricating an electro-mechanical structure having a suspended microstructure comprising the steps of:

providing a substrate;

diffusing a conductive region into a first portion of the substrate;

forming a first dielectric layer over the substrate;

depositing a second dielectric layer, different from the first dielectric layer, over the first dielectric layer;

removing a portion of the second dielectric layer from a ringed first area above the first portion of the substrate, the ringed first area having an outer edge and an inner edge;

removing substantially all of the second dielectric layer from a second area having a perimeter between the outer edge and the inner edge;

depositing a spacer layer over the second dielectric and the second area;

depositing a conductive layer over the spacer layer, from which the suspended microstructure will be formed;

forming the suspended microstructure in the conductive layer substantially over a region within the outer edge; and removing the spacer layer.

2. The method according to claim 1, wherein the substrate includes a p-silicon substrate.

3. The method according to claim 2, wherein the conductive region includes an n+ diffused region.

4. The method according to claim 1, wherein the first dielectric layer includes silicon dioxide.

5. The method according to claim 4, wherein the second dielectric layer includes silicon nitride.

6. The method according to claim 5, wherein the spacer layer includes silicon dioxide.

7. The method according to claim 1, wherein the spacer layer includes the same material as the first dielectric layer.

8. The method according to claim 1, wherein the conductive layer includes polysilicon.

9. The method according to claim 1, further comprising the step of providing a conductive path from the conductive layer to the conductive region.

10. A method for fabricating an electro-mechanical structure having a suspended microstructure comprising the steps of:

providing a substrate;

diffusing a conductive region into a first portion of the substrate;

forming a first dielectric layer over the substrate;

depositing a second dielectric layer, different from the first dielectric layer, over the first dielectric layer;

removing substantially all of the second dielectric layer from an area above the first portion of the substrate;

depositing a spacer layer over the second dielectric and the area;

depositing a conductive layer over the spacer layer, from which the suspended microstructure will be formed;

forming the suspended microstructure in the polysilicon layer substantially over a region within the area; and removing the spacer layer.

11. The method according to claim 10, wherein the substrate includes a p-silicon substrate.

12. The method according to claim 11, wherein the conductive region includes an n+ diffused region.

13. The method according to claim 10, wherein the first dielectric layer includes silicon dioxide.

14. The method according to claim 13, wherein the second dielectric layer includes silicon nitride.

15. The method according to claim 14, wherein the spacer layer includes silicon dioxide.

16. The method according to claim 10, wherein the spacer layer includes the same material as the first dielectric layer.

17. The method according to claim 10, wherein the conductive layer includes polysilicon.

18. The method according to claim 10, further comprising the step of providing a conductive path from the conductive layer to the conductive region.

* * * * *